United States Patent
Dachtera et al.

Patent Number: 5,239,506
Date of Patent: Aug. 24, 1993

[54] LATCH AND DATA OUT DRIVER FOR MEMORY ARRAYS

[75] Inventors: William R. Dachtera, Poughkeepsie; Leonard C. Ritchie; Arthur D. Tuminaro, both of LaGrangeville, all of N.Y.

[73] Assignee: International Business Machines Corporation, Armonk, N.Y.

[21] Appl. No.: 651,845

[22] Filed: Feb. 4, 1991

[51] Int. Cl.⁵ .............................................. G11C 7/00
[52] U.S. Cl. .................................. 365/189.05; 365/190
[58] Field of Search .................... 307/530; 365/189.01, 365/189.05, 189.11, 190, 225.6, 230.08

[56] References Cited

U.S. PATENT DOCUMENTS

| | | | |
|---|---|---|---|
| 4,616,342 | 10/1986 | Miyamoto | 365/189.05 |
| 4,817,054 | 3/1989 | Banerjee et al. | 365/189.05 X |
| 4,928,265 | 5/1990 | Higuchi et al. | 365/189.05 X |

*Primary Examiner*—Steven Mottola
*Attorney, Agent, or Firm*—Otho B. Ross; Charles W. Peterson, Jr.

[57] ABSTRACT

A latch and driver circuit is disclosed for use in reading out data from a random access memory cell. The invention, which may be implemented in BICMOS technology, accomplishes high-speed asynchronous latching, level translation and output driving operations. The invention includes a latch and at least one output driver coupled in parallel to a latch driver.

4 Claims, 2 Drawing Sheets

LATCH AND DATA OUT DRIVER FOR MEMORY ARRAYS

BACKGROUND OF THE INVENTION

1. Field of the Invention

The present invention relates to memory arrays and more particularly to latching and driver circuitry for use in reading data from static random access memory (SRAM) arrays. The invention may be implemented in BICMOS technology.

2. Description of the Related Art

The process of effectively reading a static random access memory cell normally requires several operations to be performed. For example, after a particular cell has been selected, a sensing operation must be performed to read the data in the cell. This typically requires a sense amplifier to sense a voltage differential across a pair of bit lines coupled to the cell. Next, it is often desired to activate a latch circuit to hold the data for further processing. This latch circuit is typically operated in synchronous fashion using a clock signal.

It is also frequently necessary to convert the data signal to a different voltage or current level in order to properly activate external logic circuitry. This is particularly important when the different stages of the data read-out circuitry are built with different transistor technologies. For example, sense amplifier circuits often use bipolar transistors and operate with a very small signal swing, whereas latch circuits and logic circuits operate at larger "ECL" (emitted-coupled logic) levels, or use FET transistors and operate at even higher "CMOS" or "BICMOS" levels.

A key design problem for most SRAMS is to provide an interface circuit between the small signal swing of a sense circuit output and the larger input signal swing normally required for the surrounding logic or driver circuits. Generally, the signal swing of the sense circuit is about a few hundred millivolts and the surrounding logic, if implemented in ECL technology, needs about 800 millivolts, or 2-3 volts if the surrounding logic is implemented in CMOS or BICMOS technology. While it is theoretically possible to have the sense amp drive to ECL levels, this is not a practical solution for most large SRAMS.

When the sense circuit must drive to CMOS or BICMOS levels, the required voltage gain is usually beyond the capability of ECL type circuits because of the saturation of the bipolar transistors. One solution has been to use a chain of CMOS inverters as an interface circuit. This, however, introduces significant delay.

A further attempt to improve performance is to use gated latches, such as given in Miyamoto U.S. Pat. No. 4,616,342 (FIG. 8), where the sense amp (29) drives a level shifter (51, 52) and a latch (28) through a pass gate (26', 27'); the latch then drives the main amplifier (29), whose output is signal DA.

SUMMARY OF THE INVENTION

The present invention improves over the prior art in many ways, such as:

(a) The elimination of pass gates and the use of a current source to provide gating. Thus, the pass gate delay is eliminated for faster performance;

(b) Including the latch in parallel with a BICMOS latch driver to provide fast signal swings to the output amplifier, for faster access;

(c) Providing for asynchronous operation of the latch;

(d) Designing the output driver with bipolar and FET devices for faster speed with large capacitive loads; and (e) Extensively embedding logic circuitry into RAM circuitry.

Briefly, the present invention comprises, in one embodiment, a latch and drive circuit comprising:

a differential sense amplifier;

a latch driver coupled to the sense amplifier;

a latch coupled to the latch driver; and at least one output driver coupled to the latch driver in parallel with the latch.

In another embodiment, the invention comprises a memory comprising:

at least one memory cell coupled to two bit lines;

a differential sense amplifier circuit coupled to the bit lines for sensing a data bit in the cell;

a cross-coupled latch driver circuit coupled to outputs of the sense amplifier circuit;

a cross-coupled latch coupled to outputs of the latch driver circuit; and first and second output driver circuits, each coupled in parallel to outputs of the latch driver circuit and to outputs of the latch.

BRIEF DESCRIPTION OF THE DRAWINGS

To facilitate further description of the invention, the following drawings are provided, in which.

DESCRIPTION OF THE PREFERRED EMBODIMENTS

Figure 1:
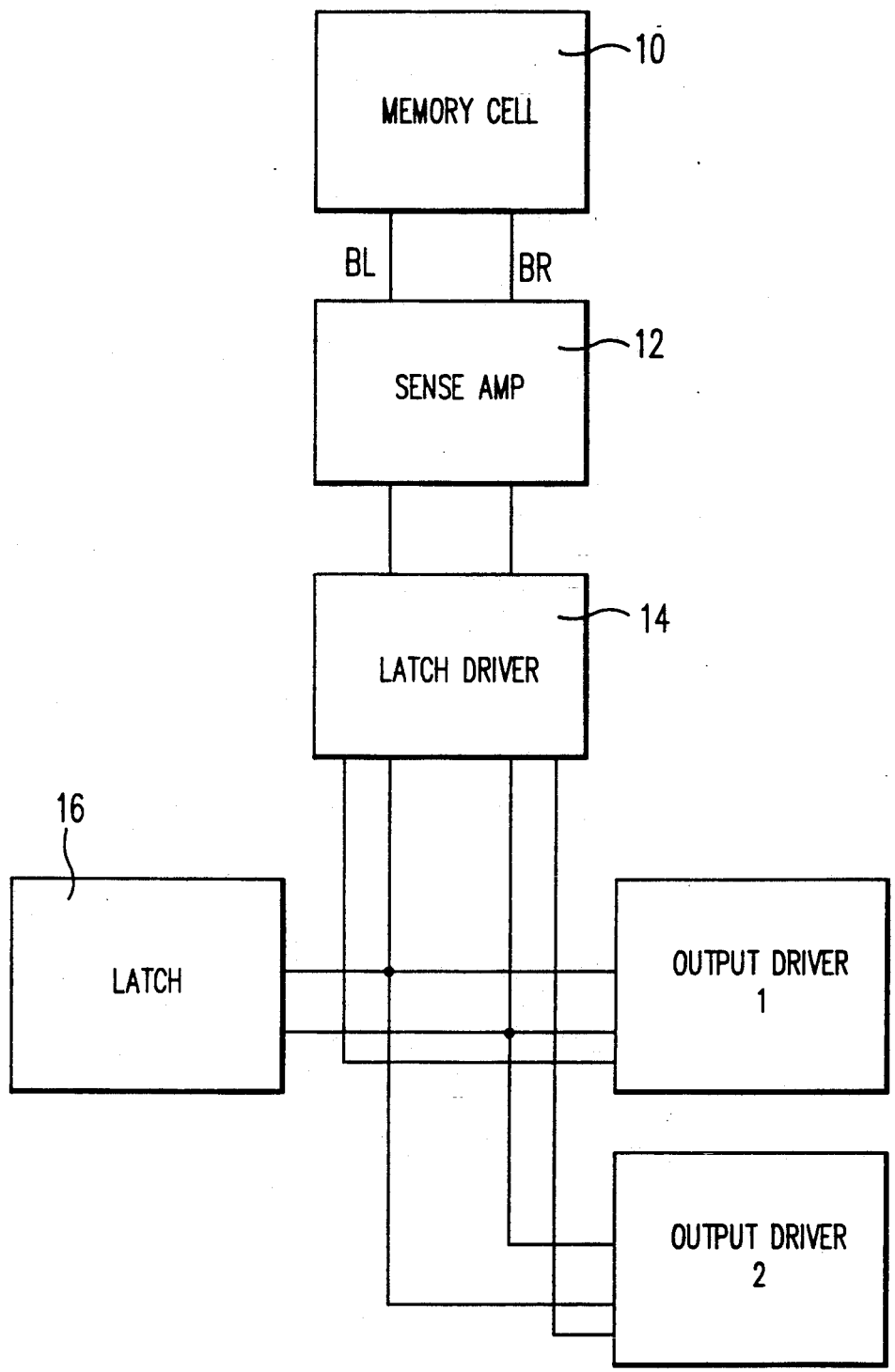
FIG. 1 is a block diagram of one embodiment of the present invention.

Referring now to FIG. 1, there is shown therein a functional block diagram of one embodiment of the present invention. The present invention is not, however, limited to this particular configuration.

In FIG. 1, a memory cell 10 is provided to store a binary digit. This cell may comprise any of several conventional types of SRAM cells, such as a 4-device or 6-device FET cell as shown in FIG. 1 of U.S. Pat. No. 4,616,342. A bipolar or BICMOS cell may also be used.

Cell 10 is coupled to two bit lines, BL and BR, and to a word line (not shown). Data is read from the cell by a conventional bipolar sense amplifier 12 coupled to the bit lines, which detects voltage differentials on the bit lines.

A feature of the present invention is the use of a latch driver circuit 14 coupled to the parallel combination of an asynchronous latch circuit 16 and an output driver circuit 1. A data output signal may be taken from the output driver for use by surrounding logic or receiver circuitry on other chips (not shown). A second output driver circuit, output driver 2, may also be included in parallel with output driver 1, to provide a data complement output, if desired.

Figure 2:
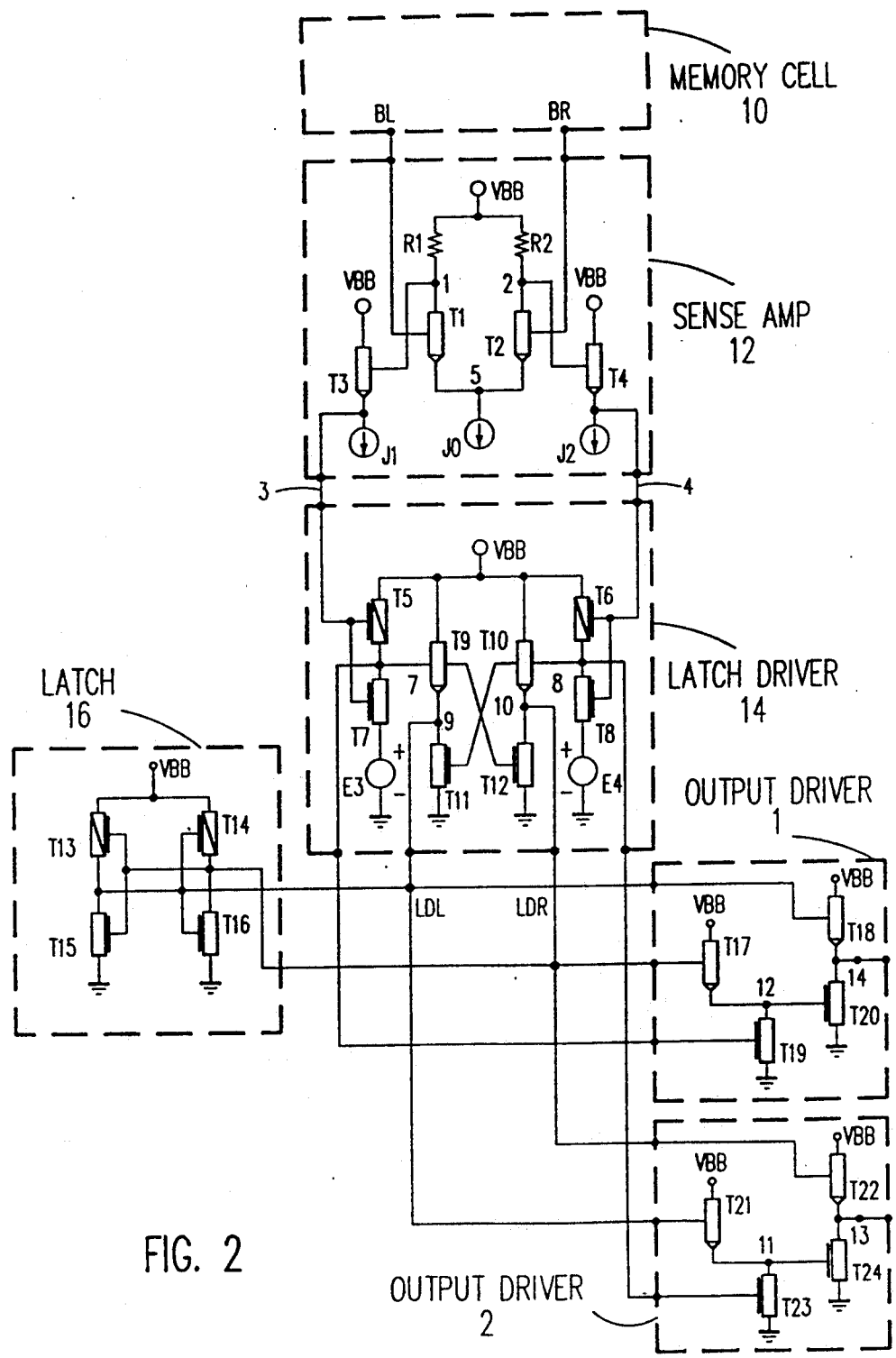
FIG. 2 is a schematic circuit diagram of one embodiment of FIG. 1.

A preferred circuit embodiment of FIG. 1 is shown in FIG. 2. Here, it can be seen that the sense amplifier stage 12 has inputs connected to the bit lines BL and BR from the typically memory array cell 10. The inputs from line BL and BR drive into the bases of transistors T1 and T2, respectively, in the sense amp stage. Transistors T1 and T2 are preferably NPN bipolar transistors. Resistor R1 connects from the VBB supply to the collector of transistor T1 at node 1. Node 1 also connects to the base of NPN transistor T3. Similarly for the right half of the sense amp, resistor R2 connects from the VBB supply to the collector of transistor T2 at node 2. Node 2 also connects to the base of NPN transistor T4. The emitters of transistors T1 and T2 are connected to a current source J0 at node 5. The emitters of transistors T3 and T4 are connected to bias current sources J1 and J2 at nodes 3 and 4, respectively. The collectors of transistors T3 and T4 are connected to the VBB supply.

The latch driver stage 14 of the present invention is preferably a BICMOS cross-coupled circuit having dual inputs from nodes 3 and 4, which are the outputs from the sense amp stage. Node 3 is connected into the gates of transistors T5 and T7 on the left half of the latch driver.

Similarly, node 4 is connected into the gates of transistors T6 and T8 on the right half of the latch driver. In the preferred embodiment, transistors T5 and T6 are P-channel MOSFETS, and transistors T7 and T8 are N-channel MOSFETS. Node 7 is connected to the drains of transistors T5 and T7, the base of NPN transistor T9 and the gate N-channel MOSFET transistor T12. Similarly, node 8 is connected to the drains of transistors T6 and T8, the base of NPN transistor T10 and the gate N-channel MOSFET transistor T11. The emitter of transistor T9 is connected to the drain of transistor T11 at node 9. Similarly, the emitter of transistor T10 is connected to the drain of transistor T12 at node 10. The sources of transistors T7 and T8 are connected to the bias supplies E3 and E4. The sources of transistors T5 and T6, and the collectors of transistors T9 and T10 are connected to the VBB supply. The sources of transistors T11 and T12 are connected to the ground supply.

Continuing with the circuit connections of FIG. 2, the latch stage 16 of the present invention is preferably a CMOS cross-coupled latch that connects into nodes 9 and 10 of the latch driver stage 14. The output driver 1 stage and the output driver 2 stage also connect into nodes 9 and 10, in parallel with the latch. In the latch stage, node 9 connects into the drains of transistors T13 and T15 and the gates of transistors T14 and T16. Similarly, node 10 connects into the drains of transistors T14 and T16 and the gates of transistors T13 and T15. In the preferred embodiment, transistors T13 and and T14 are P-channel MOSFETS, and transistors T15 and T16 are N-channel MOSFETS. The sources of transistors T13 and T14 are connected to the VBB supply and the sources of transistors T15 and T16 are connected to the ground supply.

The output driver 1 stage receives its input signals from the latch driver stage 14 and from latch 16. Node 9 connects into the base of NPN transistor T18. Node 10 connects into the base of NPN transistor T17 and node 7 connects into the gate of the N-channel MOSFET transistor T19. The emitter of transistor T17, the drain of transistor T19 and the gate of the N-channel MOSFET transistor T20 are connected together defining node 12. The emitter of transistor T18 and the drain of transistor T20 are connected at node 14 forming the output terminal of output driver 1 for supplying a data signal. The collectors of transistors T17 and T18 are connected to the VBB supply, and the sources of transistors T19 and T20 are connected to the ground supply.

The output driver 2 stage which is optional, is configured in a similar way. It receives its input signals from the latch driver stage 14 and from the latch 16. Node 10 connects into the base of NPN transistor T22. Node 9 connects into the base of NPN transistor T21 and node 8 connects into the gate of the N-channel MOSFET transistor T23. The emitter of transistor T21, the drain of transistor T23 and the gates of the N-Channel MOSFET T24 are connected defining node 11. The emitter of NPN transistor T22 and the drain of transistor T24 are connected at node 13 forming the output terminal of output driver 2 for supplying a signal which is the complement of the output driver 1 signal. The collectors of transistors T21 and T22 are connected to the VBB supply, and the sources of transistors T23 and T24 are connected to the ground supply.

In operation, the circuit of FIG. 2 provides high-speed differential level conversion, from the ECL level at lines BL and BR (typically less than 0.5 volts) to the BICMOS level at output nodes 13 and 14 (typically a 2-3 V swing). The circuit also provides high-speed latching of the data from cell 10, for use by output drivers 1 and 2. The parallel connection of the latch with the output drivers also reduces delay at the output. It should also be noted that each side the latch is driven by the latch driver in push-pull fashion, which minimizes its delay time. Thus, the latch driver accomplishes very fast writing of the latch, in parallel with driving the output drivers, and in the process accomplishes level translation from ECL to BICMOS. Output drivers 1 and 2 are arranged to drive high capacitance logic or receiver circuits, either on-chip or off-chip.

One of the advantages of this design is that the current source J0 in sense amp 12 can be turned off (deselected) to save power in the sense amp 12 and latch driver 14 as well as to provide additional logic gating capability in sensing by using dotting at nodes 1 and 2, for example.

If J0 is turned off, then the collectors of transistors T1 and T2 will go to a high level, which will drive nodes 3 and 4 to a high level. Then transistors T5 and T6 in the latch driver will be driven off and transistors T7 and T8 will be driven on, thereby, driving the nodes 7 and 8 to a low level voltage; transistors T9, T10, T11, and T12 will be driven off. Driving the nodes 7 and 8 to a low level will not affect the state of the latch 16 or the states of nodes 9 or 10. Furthermore, there is no change of the states of the output drivers 1 and 2 when nodes 7 and 8 are driven to a low value. Using output driver 1 as an example, assume node 10 is low and node 7 is high. Then when node 7 is driven low, transistor T19 is put into a lower conduction state but the desired low level at node 12 is maintained. Now suppose output driver 1 has node 10 high. Then node 7 is normally low so that there is no change for T19.

While the invention has been particularly shown and described with reference to the preferred embodiments thereof, it will be understood by those skilled in the art that various changes in form and detail may be made therein without departing from the spirit and scope of the invention.

We claim:

1. A latch and drive circuit comprising:
   differential sense amplifier;
   a BICMOS cross-coupled latch driver coupled to the sense amplifier;
   a latch coupled to the latch driver; and at least one output driver coupled to the latch driver in parallel with the latch.

2. The circuit of claim 1 in which the sense amplifier comprises a bipolar differential sense amplifier circuit.

3. A memory comprising:
at least one memory cell coupled to two bit lines;
a differential sense amplifier circuit coupled to the bit lines for sensing a data bit in the cell;
a cross-coupled latch driver circuit coupled to outputs of the sense amplifier circuit;
a cross-coupled latch coupled to outputs of the latch driver circuit; and
first and second output driver circuits, each coupled in parallel to outputs of the latch driver circuit and to outputs of the latch.

4. The circuit of claim 3 in which the latch driver circuit and the output driver circuits each comprise a BICMOS circuit, and the differential sense amplifier circuit comprises a bipolar circuit.

* * * * *